United States Patent [19]

Gorter et al.

[11] 4,038,597

[45] July 26, 1977

[54] MAGNETORESISTANCE DETECTION DEVICE HAVING NOISE SUPPRESSION

[75] Inventors: Frederik Willem Gorter; Henricus Petrus Johannes Wijn, both of Eindhoven, Netherlands

[73] Assignee: U.S. Philips Corporation, New York, N.Y.

[21] Appl. No.: 649,560

[22] Filed: Jan. 15, 1976

Related U.S. Application Data

[63] Continuation of Ser. No. 505,243, Sept. 12, 1974, abandoned.

[30] Foreign Application Priority Data

Sept. 22, 1973 Netherlands .......................... 7313096

[51] Int. Cl.² ............................................ G01R 33/02
[52] U.S. Cl. ................................. 324/46; 340/174 TF
[58] Field of Search ............... 324/43 R, 45, 43, 34 B; 340/174 TF

[56] References Cited

U.S. PATENT DOCUMENTS

| 3,842,407 | 10/1974 | Argyle et al. | 340/174 TF |
| 3,899,779 | 8/1975 | Malozemoff | 340/174 TF |

FOREIGN PATENT DOCUMENTS

| 1,063,037 | 3/1967 | United Kingdom | 324/46 |

OTHER PUBLICATIONS

Almasi et al., Magnetoresistive Detector for Bubble Domains, Jour. of App. Phys., vol. 42, No. 4, Mar. 1971, pp. 1268-1269.
Walker, E., Magnetoresistive Detector, IBM Tech. Bul., vol. 15, No. 2, July 1972, p. 500.
Takahashi et al., Ring Type Permalloy Detector, IEEE Trans. on Mag., Sept. 1972, pp. 462-464.

*Primary Examiner*—Robert J. Corcoran
*Attorney, Agent, or Firm*—Frank R. Trifari; Carl P. Steinhauser

[57] ABSTRACT

A magnetoresistive detection device for determining the presence or absence of a single-wall magnetic domain at a position in a thin layer of magnetic material in which stable single-wall magnetic domains can be moved, comprising a sensing element of magnetoresistive material which is provided with respect to the layer of magnetic material in such manner that the resistance thereof varies when a single-wall magnetic domain is present at the said position. The device comprises means to produce an alternating magnetic field so as to modulate the size of a single-wall magnetic domain present at the said position, and comprises a filter which passes only interference-free terms of the signal detected by the sensing element.

3 Claims, 3 Drawing Figures

MAGNETORESISTANCE DETECTION DEVICE HAVING NOISE SUPPRESSION

This application is a continuation of application Ser. No. 505,243, filed Sept. 12, 1974, now abandoned.

The invention relates to a magneto-resistive detection device for determining the presence or absence of a single-wall magnetic domain at a position in a sheet of magnetic material in which stable single-wall magnetic domains can be moved, comprising a sensing element of magneto-resistive material which is provided with respect to the sheet in such a manner that the resistance thereof varies when a single-wall magnetic domain is present at the said position.

It is known that the magnetisation vector of a magneto-resistive sensing element can be rotated when the sensing element is coupled magnetically to the stray field of a single-wall magnetic domain, hereinafter termed bubble domain. This in turn has the result that the electrical resistance of the sensing element varies, which results in a signal voltage in the case in which a constant current is flowing through the sensing element or in a signal current in the case in which a constant voltage is set up across the sensing element (Proceedings of the T.E.E.E., April 1973, pp. 442-43).

Magneto-resistive sensing devices for transmitting information represented by bubble domains present certain advantages, for example, as regards the simple manufacture and the good signal-to-noise ratio.

Although magneto-resistive elements in themselves can be used for detection purposes in any device in which bubble domains are moved in thin magnetic layers suitable for that purpose, it is in particular of advange when the domain-propagation means consist of soft magnetic strips which are provided on the thin magnetic layers, for example, metal layers in the form of a T, I. or chevrons. In that case magneto-resistive elements may be manufactured from the same material and be provided, if desired, in the same process step.

It has been found, however, that the rotating magnetic field used in that case for moving the bubble domains and operating in the plane of the magnetic layer causes a strong interference on the signal of the magneto-resistance elements serving for detection, since due to said rotating field the rotation of the magnetisation vector of the sensing element is influenced in an undesired manner. It is unavoidable that the propagation means consisting of soft magnetic material are present very close to the sensing elements. This provides a magnetisation contribution which in the most unfavourable case can fully exceed the relatively small variation which is the result of the presence or absence of a bubble domain. In addition, the presence of adjacent bubble domains may in, particular, be a reason for the occurrence of interferences.

It is an object of the invention to provide an improved magneto-resistance detection device which is not sensitive to interference fields.

For that purpose, the device according to the invention comprises means for generating an alternating magnetic field so as to modulate the size of a single-wall magnetic domain present at the said position together with a filter which passes only interference-free terms of the signal detected by the sensing element.

The invention is based on the discovery that by modulating at the area of the sensing element, the size of a single-wall magnetic domain to be detected, the signal detected by the sensing element can be made essentially free from interference field contributions. Actually, by modulating the size of the magnetic domain the stray field of the domain is modulated and hence the detection signal supplied by the magneto-resistive element is also modulated. An analysis of this signal shows that it comprises terms in which all interference fields occur and terms which are "interference-free." As will be explained hereinafter, said interference-free terms can be selected by means of suitably chosen filters.

The invention will be described in greater detail, by way of example, with reference to the drawing.

Figure 1:
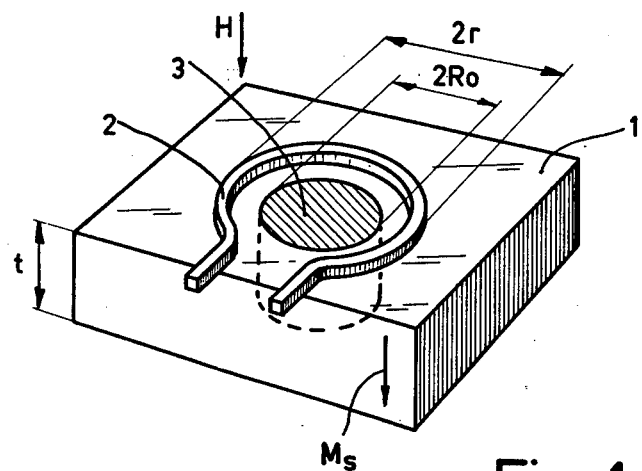
FIG. 1 shows a plate of bubble material on which a loop-like magneto-resistive sensing element is provided.

On a plate 1 (or thin film) of a monocrystalline garnet material in which bubble domains can be propagated, a loop-like strip 2 of an Ni alloy is provided in such manner that the stray field of a bubble domain 3 can vary the resistance of the strip 2. A typical value for the relative variation is 1%. If a constant current I flows through the loop 2, said resistance variation $\Delta_R$ appears as a voltage variation I $\Delta$ R. However, a magnetic field in the plane of the plate 1, used for moving bubble domains in the plate 1, as well as the presence of bubble domains in the proximity of the bubble domain 3 may cause interferences. When an alternating current is passed through the loop 2 it is possible to modulate the diameter $2R_o$ of the bubble domain 3 and hence to make the measured voltage variation essentially free from interference field contributions. This may be proved as follows:

R is the radius of the bubble domain 3,
$R_o$ is the radius in the equilibrium condition
$t$ is the thickness of the plate 1
$M_s$ is the magnetisation of the material of the plate 1
$H_z$ is a magnetic field perpendicular to the plate 1, then it holds that:

$$\frac{R}{t} = \frac{R_0}{t} \frac{(1 - 14 H_z)}{4 \pi M_s}$$

The field $H_z$ is produced by conveying a current I through the loop 2 of radius $r$ and occurs as being superimposed upon a bias field H necessary for the stabilisation of the bubbles, so $H_z = I/2 \pi r$ so that it may also be written that $$R/t = R_0(1 + \frac{I}{I_r})/t$$

The radial field of the bubble domain is represented by:

$$h_r = \frac{H_r}{4\pi M_s} = h_0 + h_1(\frac{R}{t} - 1)^2 = h_0 + h_1(I/I_r)^2 \text{ as } r/t = 1 \quad \text{Ia}$$

$$h_r = h_2 + h_3(\frac{R}{t} - 1) = h_4 + h_5(I/I_r) \text{ as } r/t = 1.2. \quad \text{Ib}$$

The numbers $h_1, h_2, h_3, h_0$ can be determined from experiments. The resistance $\rho$ of the strip 2 varies quadratically with the radial field strength, so that it may be written:

$$\rho > \rho_o + \Delta \rho_m (h^2_r / h_{2m}),$$

wherein $h_m$ is a geometry and material-dependant parameter and $\Delta\rho_m$ is the maximum variation of the resistance which may occur in the material.

In order to modulate the diameter of the bubble domain, an alternating current is used for I, for example $$I = I_o \sin \omega t$$

If the center line of the loop 2 is at the edge of the bubble domain 3, then $R_o/r = 1$ and $r/t$ is chosen to be 1 and 1,2, respectively, it follows by combination of the preceding formulae:

$$V = I_0 \sin \omega_t \rho = V_0 \sin \omega_t + \frac{\Delta\rho_m V_0}{\rho_0} \left[ \left(\frac{h_0}{h_m}\right)^2 + \right. \tag{2a}$$

$$\left. \frac{2h_0 h_1}{h_m^2} \left(\frac{I_0}{I_r}\right)^2 \sin^2 \omega_t + \left(\frac{h_1 I_0^2}{h_m I_r^2}\right)^2 \sin^4 \omega_t \right] \sin \omega_t$$

$$V = I_0 \sin \omega_t \rho = V_0 \sin \omega_t + \frac{\Delta\rho_m V_0}{\rho_0} \left[ \left(\frac{h_4}{h_m}\right)^2 + \right. \tag{2b}$$

$$\left. \frac{2h_4 h_5}{h_m^2} \left(\frac{I_0}{I_r}\right) \sin \omega_t + \left(\frac{h_5 I_0}{h_m I_r}\right)^2 \sin^3 \omega_t \right] \sin \omega_t.$$

So the measured signal V comprises terms in $\omega$, 3 $\omega$, 5 $\omega$, respectively, and in the second case in $\omega$, 2 $\omega$, 3 $\omega$, and a direct voltage term. For a good understanding it is to be noted that the frequency is chosen to be high with respect to the propagation frequency of the system so that the expression direct voltage has only a relative meaning. The interference fields and the constant $\rho_o$ give voltage terms which are modulated with sin $\omega$ t. By electronically selecting one of the other terms, an interference-free signal can thus be obtained. For that purpose, for example, a selective amplifier, may be used tuned to 2 $\omega$, 3 $\omega$ or 5 $\omega$ (or a band filter), or the direct voltage term may also be measured by using a low pass filter.

Figure 2:
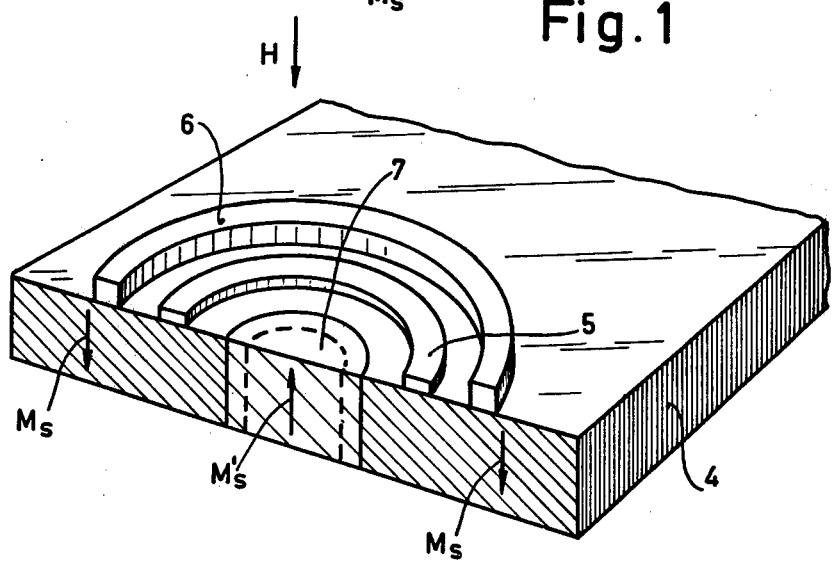
FIG. 2 is a partial cross-sectional view of a plate of bubble material on which a loop-like magneto-resistance sensing element as well as a loop-like current wire are provided.

Besides by variation of the detector current as described above, the diameter of the bubble domain in may also be modulated by providing a separate loop-like current wire and conveying an alternating current through it. This situation is shown in FIG. 2. In this figure a plate of garnet material is shown in cross-section and is denoted by 4, a magneto-resistive sensing element is denoted by 5, a loop-like current conductor by 6 and a bubble domain by 7. A current $I = I_o \sin \omega_o t$ is conveyed through the conductor (which may be, for example, gold) so as to modulate the diameter of the bubble domain 7, and a detector current $I = I_1 \sin \omega_1 t$ is conveyed through the sensing element 5 which may be, for example, an Ni-Fe alloy) (if desired, $\omega_1 = 0$). In that case the detection voltage contains terms as follows:

$$\frac{\Delta\rho}{\rho} \cdot V_0 \cos (\omega_0 - \omega_1) - \cos (\omega_0 + \omega_1) .$$

The interferences are now in terms with sin $\omega_1 t$. Interference-free detection may take place by using a selective amplifier which is tuned to the frequency ($\omega_o = \omega_1$) or to the frequency ($\omega_o - \omega_1$).

If the variation of the diameter of the bubble domain is to be made as large as possible without the current $I_o$ required for that purpose becoming too large, the bubble domain may be resonated. This is based on the fact that a mass m may be allotted to the wall of a bubble domain. In certain circumstances, resonance may occur, for example, at frequencies between 10 and 100 MHz.

Figure 3:
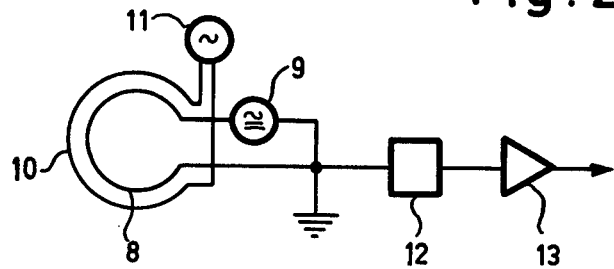
FIG. 3 shows a partial block diagram of a detection device according to the invention.

FIG. 3 shows diagrammatically how a loop-like magneto-resistive element 8 is connected to a current source 9 which supplies a direct current if a separate current loop 10 which is connected to the alternating voltage source 11 is present to supply an alternating field with which the diameter of the bubble domain to be detected is modulated and which supplies an alternating current when the said alternating field is to be produced by means of the loop 8 itself. The detection signal is supplied to the amplifier 13 via the band filter 12.

What is claimed is:

1. A magneto-resistive detection device for determining the presence or absence of a single-wall magnetic domain at a position in a sheet of magnetic material in which stable single-wall magnetic domains can be moved, comprising which stable single-wall magnetic domains can be moved, comprising a loop-shaped element of magneto-resistive material on said sheet of magnetic material disposed so that the resistance thereof varies when a single-wall domain is present at said position, means to energize said sensing element with an a-c current signal, and means to detect a signal produced by said loop-shaped sensing element when a single-wall magnetic domain is present at said position, said detection means including a selective amplifier tuned to one of the second, third, and fifth harmonics of said signal, said harmonics being interference free.

2. A magneto-resistive detection device for determining the presence or absence of a single wall magnetic domain at a position in a sheet of magnetic material in which stable, single-wall magnetic domains can be moved, comprising on said sheet of magnetic material a magneto resistive ring-shaped sensing element surrounding said position and being coupled to a source of electrical current of frequency $\omega_1$, and an energizing loop surrounding said position and being coupled to a source of electrical current having a frequency $\omega_o$ for modulating the diameter of the single-wall domain, said device further comprising detection means coupled to the sensing element and including a selective amplifier tuned to one of the frequencies $\omega_o + \omega_1$ and $\omega_o - \omega_1$, said frequencies being interference free.

3. A magneto-resistive detection device for determining the presence or absence of a single-wall magnetic domain at a position in a sheet of magnetic material in which stable single-wall magnetic domains can be moved, comprising a loop-shaped sensing element of magneto-resistive material on said sheet of magnetic material disposed so that the resistance thereof varies when a single-wall domain is present at said position, means to energize said sensing element with an a-c current signal, and means to detect a signal produced by said loop-shaped sensing element when a single-wall magnetic domain is present at said position, said detection means including a low pass filter to filter out and sense the D.C. voltage term of the signal produced by the sensing element, said term being interference free.

* * * * *

UNITED STATES PATENT AND TRADEMARK OFFICE
CERTIFICATE OF CORRECTION

PATENT NO. : 4,038,597
DATED : July 26, 1977
INVENTOR(S) : FREDERIK W. GORTER ET AL It is certified that error appears in the above-identified patent and that said Letters Patent are hereby corrected as shown below:

Col. 1, line 25, change "T.E.E.E." to read --I.E.E.E.--;

Col. 1, line 44, change "resistance" to read --resistive--;

Col. 1, line 54, change "in, particular" to read --, in particular--;

Col. 3, line 48, delete "in";

Signed and Sealed this

Twenty-fourth Day of January 1978

[SEAL]

Attest:

RUTH C. MASON
*Attesting Officer*

LUTRELLE F. PARKER
*Acting Commissioner of Patents and Trademarks*